US010499521B2

(12) United States Patent
Lebkuecher

(10) Patent No.: US 10,499,521 B2
(45) Date of Patent: Dec. 3, 2019

(54) HOUSING FOR RECEIVING A CIRCUIT BOARD WITH AN OVERVOLTAGE PROTECTION UNIT, AND AN OVERVOLTAGE PROTECTION MODULE

(71) Applicant: Pepperl+Fuchs GmbH, Mannheim (DE)

(72) Inventor: Thomas Lebkuecher, Ludwigshafen (DE)

(73) Assignee: Pepperl + Fuchs AG, Mannheim (DE)

( * ) Notice: Subject to any disclaimer, the term of this patent is extended or adjusted under 35 U.S.C. 154(b) by 0 days.

(21) Appl. No.: 16/029,955

(22) Filed: Jul. 9, 2018

(65) Prior Publication Data

US 2019/0014675 A1 Jan. 10, 2019

(30) Foreign Application Priority Data

Jul. 7, 2017 (EP) .................................. 17001162

(51) Int. Cl.
*H05K 5/02* (2006.01)
*H05K 1/11* (2006.01)
(Continued)

(52) U.S. Cl.
CPC ........... *H05K 5/0256* (2013.01); *H05K 1/117* (2013.01); *H05K 5/0026* (2013.01); *H05K 5/0221* (2013.01); *H05K 1/0257* (2013.01)

(58) Field of Classification Search
CPC .... H05K 5/0256; H05K 5/0026; H05K 1/117; H05K 5/0221; H05K 7/1435; H05K 1/0257; H01T 4/04
See application file for complete search history.

(56) References Cited

U.S. PATENT DOCUMENTS 5,921,385 A 7/1999 Plötz et al.
6,239,987 B1 * 5/2001 Shyr ..................... H01L 23/057
257/724
(Continued)

FOREIGN PATENT DOCUMENTS

JP         04352394 A    * 12/1992
WO    WO 2014/173458 A1    10/2014
WO       WO2014173458 A1    10/2014

OTHER PUBLICATIONS

Phoenix Contact, "Surge protection device—TT-EX(1)-M-24DC-2803865," Brochure, pp. 1-8 (Dec. 16, 2016) with English translation.

(Continued)

*Primary Examiner* — Rockshana D Chowdhury
(74) *Attorney, Agent, or Firm* — Muncy, Geissler, Olds & Lowe, P.C.

(57) ABSTRACT

A housing for receiving a circuit board with an overvoltage protection unit and overvoltage protection module. The housing includes a support frame and a film. The support frame is formed of a thermoplastic material and has a main leg, two side legs adjoining the main leg at one end in each case, and at least one lateral flat brace. The film is formed of a thermoplastic material and is formed U-shaped. An end face of the film at least partially covers an end face of the main leg, each side surface of the film at least partially covering the two side legs and the brace. The film is materially connected to the side legs such that the housing made up of the support frame and film is at least partially open on a side opposite the end face of the film.

18 Claims, 3 Drawing Sheets

(51) Int. Cl.
*H05K 5/00* (2006.01)
*H05K 1/02* (2006.01)

(56) References Cited

U.S. PATENT DOCUMENTS

| | | |
|---|---|---|
| 9,531,094 B2 | 12/2016 | Lebkuecher et al. |
| 2002/0036898 A1* | 3/2002 | Miyakawa ............. H05K 3/284 361/757 |
| 2002/0129954 A1 | 9/2002 | Griffis |
| 2004/0240190 A1* | 12/2004 | Hsu ....................... H05K 1/147 361/797 |
| 2005/0286237 A1 | 12/2005 | Barile et al. |
| 2012/0194958 A1* | 8/2012 | Matthiesen .......... H01H 37/761 361/103 |
| 2012/0229246 A1 | 9/2012 | Depping et al. |
| 2015/0364281 A1 | 12/2015 | Depping et al. |

OTHER PUBLICATIONS

Surge Protection Device—TT-EX(I)-M-24DC-2803865, Phoenix Contact pp. 1-8.

* cited by examiner

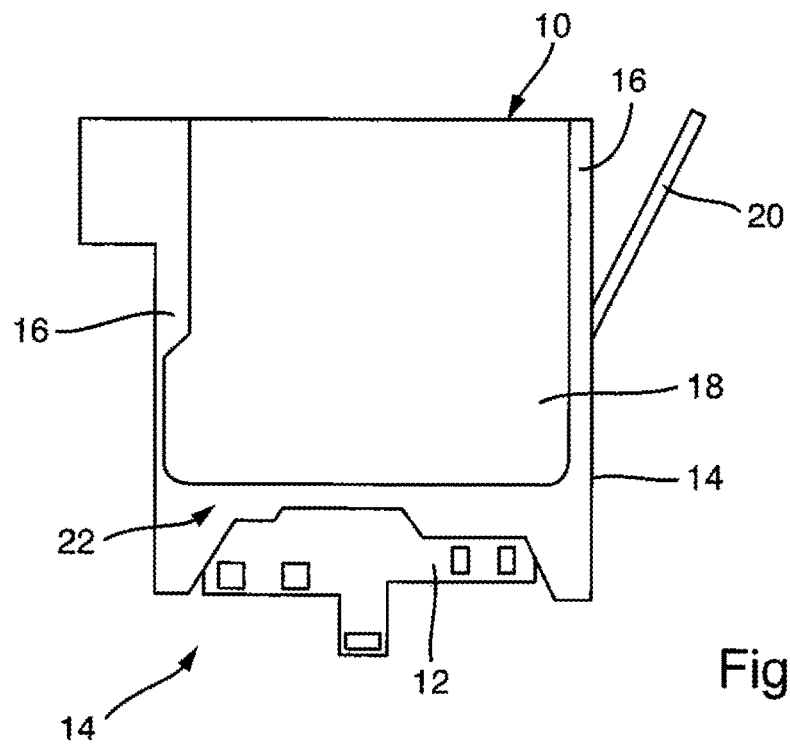
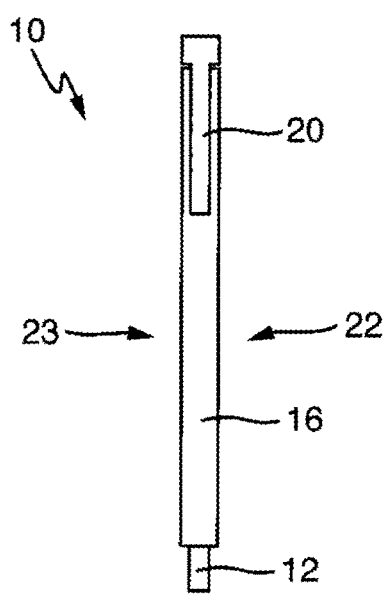

HOUSING FOR RECEIVING A CIRCUIT BOARD WITH AN OVERVOLTAGE PROTECTION UNIT, AND AN OVERVOLTAGE PROTECTION MODULE

This nonprovisional application claims priority under 35 U.S.C. § 119(a) to European Patent Application No. 17 001 162.1, which was filed on Jul. 7, 2017, and which is herein incorporated by reference.

BACKGROUND OF THE INVENTION

Field of the Invention

The invention relates to a housing for receiving a circuit board with an overvoltage protection unit and to an overvoltage protection module.

Description of the Background Art

A receiving socket for receiving and contacting an electronic module is known from WO 2014/173458 A1, which corresponds to U.S. Pat. No. 9,531,094, and which is incorporated herein by reference, and which teaches that a receiving socket is integrated via corresponding connections into a circuit and an electronic module is easily plugged onto the module and electrically connected by means of two contact blades.

Electronic modules and the connections to a circuit, e.g., by means of a top-hat rail, are typically standardized in regard to their external dimensions and generally must be arranged in a row as far as possible without joints.

The surge protection device TT-EX(I)-M-24DC-2803865 from PHOENIX CONTACT Deutschland GmbH is, for example, a terminal block with a standard height of ca. 6.1 to 6.2 mm. The housing wall on the side has a thickness of ca. 0.75 mm. Because the gas discharge tubes employed already have a diameter of ca. 5 mm, the circuit board of the surge protection device has a cutout in the region of the gas discharge tubes. Further, a side wall support structure of the housing has an opening above the gas discharge tubes; i.e., the housing is open on the side wall. Both measures are used to be able to maintain the height.

SUMMARY OF THE INVENTION

It is therefore an object of the invention to provide a device that refines the prior art.

According to an exemplary embodiment of the invention, a housing for receiving a circuit board with an overvoltage protection unit comprises a support frame and a film, wherein the support frame is formed at least partially of a thermoplastic material and has a main leg, two side legs, adjoining the main leg at one end in each case, and at least one lateral, flat brace extending between the two side legs.

The film is formed at least partially of a thermoplastic material and is formed U-shaped with an end face and two side surfaces, wherein the end face of the film at least partially covers an end face of the main leg, each side surface of the film at least partially covers the two side legs and the brace, and the film is materially connected to the side legs, such that the housing made up of the support frame and film is at least partially open on a side opposite the end face of the film.

A flat plastic body with a small thickness or wall thickness and a preferably low area moment of inertia is referred to as the film.

A U-shaped film can be positioned particularly easily on or around the support frame by pushing on, so that the housing is particularly easy to produce.

The film is non-positively, i.e. force fittingly, and/or materially connected to the support frame, preferably by welding or by heat staking, such that the film and the support frame together form a housing of the overvoltage protection module. For this purpose, the support frame can have welding areas, for example, in an area of two side legs.

The support frame can be a flat, only partly bordered receptacle for a circuit board, wherein at least one support structure opposite the main leg is missing and enables protrusion of an inserted circuit board beyond the first side wall support structure. The stability of the support frame is increased by the lateral bracing, without restricting or reducing too greatly an interior space of the housing.

The film can form at least part of an end face of the housing and of two side surfaces of the housing and that the side legs form at least one top side and one bottom side of the housing.

Furthermore, the housing can have a planar side wall and as a result, multiple housings can be arranged in a row virtually or completely without joints.

An advantage is that the thickness of the side wall can be reduced by means of the film such that the housing is completely closed on the side as well. In other words, the circuit board is protected against environmental influences. Furthermore, live components are now protected against contact. The reliability is thereby increased.

A further advantage is that the ratio of the thickness of the housing parts to the component diameter or thickness improves over the prior art. Even with a small width, components that are relatively thick or have a large diameter can be joined together in the housing with a small overall width.

The circuit board is also surrounded at least along the top side or bottom side by a part of the support frame only in the area of brace; otherwise a top side of the circuit board and a bottom side of the circuit board are enclosed solely by the film. As a result, the clear height of the housing in the area without bracing is the housing width, optionally required by a standard, minus the thickness of the film and is not limited by the thickness of supporting frame walls.

The brace can be formed as a surface with at least one through opening or as a web. Thus, at least in the area of the through openings or in areas in front of or behind the web, a maximum clear width is achieved in the housing interior.

The support frame can be formed of a different material than the film.

The support frame in an extension of the main leg, can have an additional receptacle, adjoining the second side leg or on the side leg, for a digital connector having at least four contacts.

A part of the support frame that adjoins the support frame part receiving the circuit board and provides space for a digital connector can be referred to as an additional receptacle.

The support frame can have a mechanical lock, e.g., a movable pin or hook, on at least one of the two side legs, wherein the mechanical lock acts parallel to a surface normal of the end face of the main leg.

The lock acts in a direction opposite the insertion direction, for, example by means of a pin or a hook-shaped molded part and prevents release of the plug connection by means of a form fit connection.

The two side legs each can have an end face, a first side surface, adjoining the end face, and a second side surface, adjoining the end face and opposite the first side face, and in particular the end faces of the side legs have a width from the first side surface to the second side surface, wherein the width is less than or equal to a maximum width of the end face of the main leg.

A distance between the first side surface of the two side legs to the second side surface in an area covered by the film is constant or changes in a continuous manner.

The main leg of the support frame can have at least one first area with a maximum width, measured in a direction running parallel to a surface normal of the brace, wherein the maximum width is less than 7 mm or in a range between 6.3 mm and 6.1 mm or exactly 6.2 mm or less than 6.2 mm.

The end face of the main leg can have at least one second area, delimited by two steps, with a second width, wherein the second width is smaller than the first width.

The end face of the main leg can have a constant or substantially constant width at least in an area covered by the film.

The end face of the main leg can have at least one through opening or at least one cutout. A through opening extending from an end face edge, similar to a notch, is referred to as a cutout. By means of the through opening or cutout, the signal of an optical signal transmitter, e.g., an LED, positioned on the top side of the circuit board in front of the at least one through opening, can reach the outside.

The film can cover the at least one through opening or the at least one cutout of the end face of the main leg with a first film section, wherein the first film section is transparent.

The first side leg and/or second side leg can have at least one alignment plug and the film has a through hole corresponding to the alignment plug. The at least one alignment plug can be arranged on at least one side surface, in particular closer to an end remote from the main leg.

One of the first and/or second side legs can have a bevel terminating with the film. The bevel can be arranged on a side surface of the side leg and can start at an end adjoining the main leg.

The bevel provides an adjustment aid for positioning the film on or around the support frame which is easy to produce and which terminates with the film preferably both in regard to the width and in regard to the lateral position.

The end face of the film can have an end face width from the first side surface to the second side surface, wherein the end face width exceeds by at most 10% the width of the end face of the main leg in an area covered by the film.

The film can be imprinted, as a result of which the manufacturing process of the overvoltage protection module can be simplified overall. An advantage is that the imprint on the film can be changed easily and quickly.

The film can have a thickness less than 0.35 mm or less than 0.25 mm, the thickness of the film being greater than 0.05 mm.

The main leg, the side legs, and the brace can have a thickness of at least 0.25 mm or at least 0.30 mm. The legs and brace can have a thickness less than 2.0 mm.

The first side leg and/or second side leg can have a length, wherein the maximum width of the end face of the main leg to the length of the side legs has a ratio of at least 1:5 or at least 1:10.

The maximum width of the end face of the main leg to a length of the main leg can have a ratio of at least 1:5 or at least 1:10.

The overvoltage protection unit can have a gas discharge tube.

An overvoltage protection module can have a circuit board with an overvoltage protection unit and a housing of the type described above, wherein the circuit board preferably has a contact blade with at least one contact surface and the contact blade of the circuit board protrudes beyond the brace of the support frame or beyond the first side leg and/or second side leg. Particularly preferably, the overvoltage protection unit comprises a gas discharge tube.

The film does not cover the contact blade so as not to impede either the plugging in or the electrical contacting. An electrical contact between a circuit of the circuit board and an external circuit is produced by means of the contact surface on the contact blade and corresponding counterparts of the other component.

The overvoltage protection module is connected to a further component, for example, a receiving socket, by means of the at least one circuit board contact blade projecting beyond the first side wall support structure by plugging in.

An advantage of the device of the invention is that the overvoltage protection module has a completely closed housing, which can be produced simply and cost-effectively.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIGS. 1A and 1B show a schematic view of an embodiment of the invention of an overvoltage protection module;

DETAILED DESCRIPTION

Figure 2A:
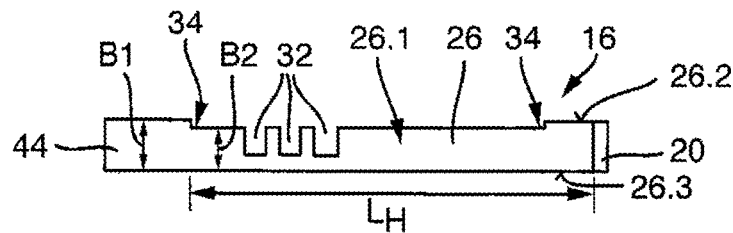
FIGS. 2A and 2B show a schematic view of an embodiment of the invention of a support frame of the overvoltage protection module.

FIGS. 1A and 1B show a top plan view and a side view, respectively, of a first embodiment of an overvoltage protection module 14, comprising a circuit board 12 and a housing 10, wherein housing 10 is formed by a support frame 16 and a film 18 and has a mechanical lock 20.

Film 18 rests on a lateral, flat brace 22 of support frame 16.

Figure 2B:
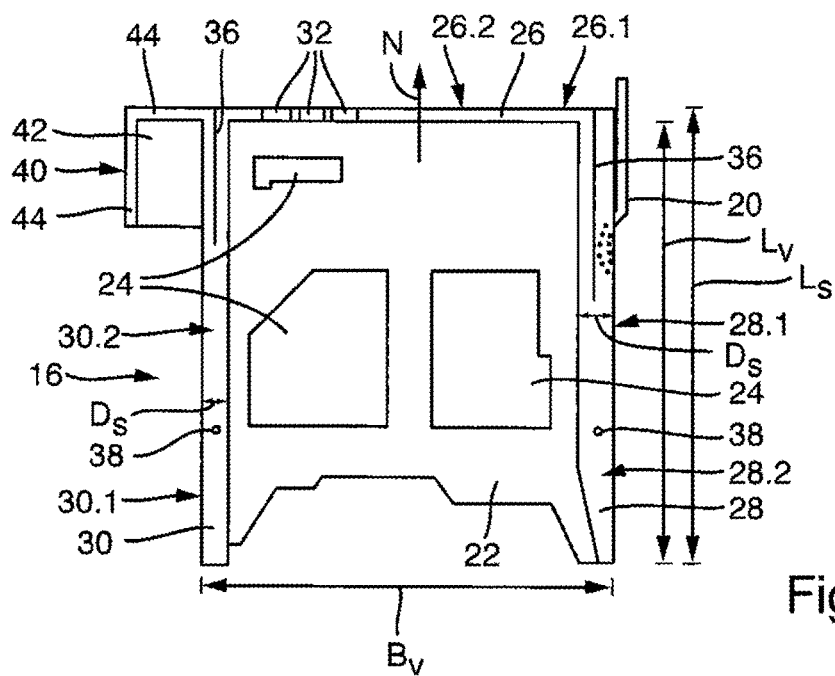

In the illustrations of FIGS. 2A and 2B, support frame 16 of overvoltage protection module 10 from FIG. 1 is shown schematically in a side view and in a top plan view.

Support frame 16 has a main leg 26, two side legs 28 and 30, a brace 22, and lock 20. Main leg 26 and the two side legs 28 and 30 each have an end face 26.1, 28.1, or 30.1, respectively, and in each case a first side surface 26.2, 28.2, or 30.2, adjoining the respective end face 26.1, 28.1, and 30.1, and a second side surface 26.3, 28.3, or 30.3, adjoining the end face and opposite first side surface 26.2, 28.2, or 30.2, respectively. End face 26.1 of main leg 26 at least partially forms an end face of housing 10. End face 28.2 of first side leg 28 forms a bottom side of housing 10 and end face 30.1 of second side leg 30 forms a top side of housing 10.

Brace 22 is formed flat and extends between second side surfaces 28.3, 30.3 of side legs 28, 30 and up to second side surface 26.3 of main leg 26. Brace 22 has a width $B_v$, a length $L_v$, and three through openings 24.

End face 26.1 of main leg 26 has three cutouts 32, a maximum width B1 in an outer area, a second, reduced width B2 in a central area, and a length $L_H$, wherein the second reduced width B2 is slightly smaller than maximum width B1. Ideally, the difference between maximum width B1 and second, reduced width B2 corresponds to a thickness $D_F$ of film 18. Due to the difference between widths B1 and B2, end face 26.1 of main leg 26 has two steps 34 along an upper edge, wherein a distance between two steps 34 ideally corresponds to a width $B_F1$ of film 18.

The two steps 34 each continue as an edge or bevel 36 at least partially along first side surfaces 28.2 and 30.2 of the two side legs 28 and 30 and serve as a guide rail or adjustment aid for film 18. In addition, first side surfaces 28.2 and 30.2 of the two side legs 28 and 30 each have an alignment plug 38, e.g., a spike or a pin.

A width of end faces 28.1 and 30.1 of the two side legs 28, 30 corresponds to first width B1 of end face 26.1 of main leg 26. Side legs 28 and 30 each have a length $L_s$ and a thickness $D_s$.

In an extension of main leg 26 and adjacent to end face 30.1 of second side leg 30, support frame 16 has an additional receptacle 40, wherein additional receptacle 40 has two side walls 44 and a flat, completely closed brace 42 between side walls 44 and second side leg 30.

Additional receptacle 40 or its side walls 44 in the illustrated exemplary embodiment have width B1, so that end face 26.1 of the main leg merges without steps into side wall 44 of additional receptacle 40.

Lock 20 is arranged in and on end face 28.1 of first side leg 28, wherein a hook for release by means of a lever is recessed in first side leg 28 and for locking is moved into a position projecting beyond end face 28.1 of the first side leg.

Support frame 16 does not have a further brace or side wall structure opposite brace 22.

Figure 3:
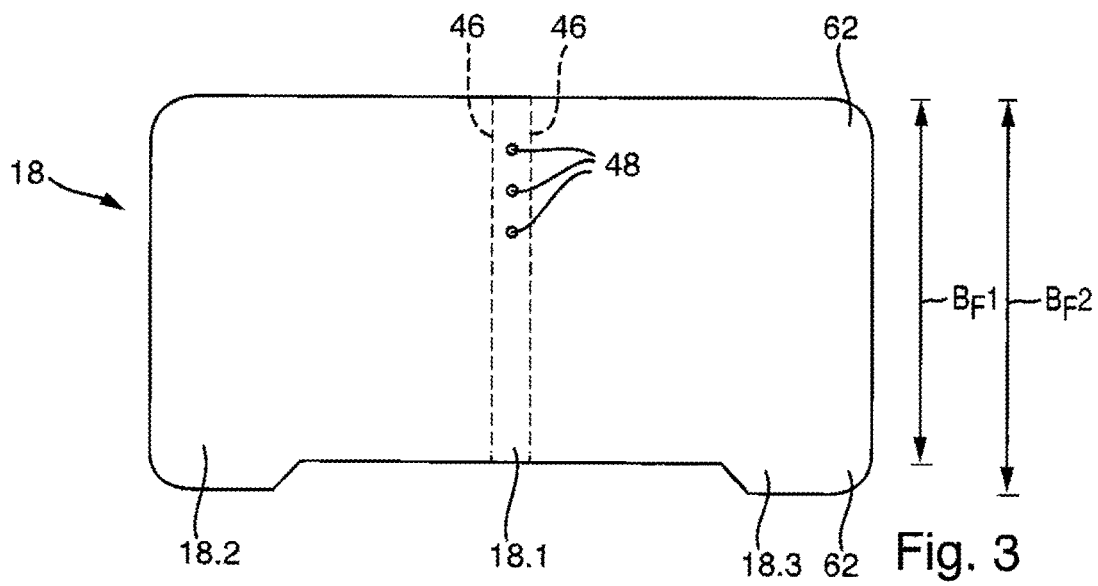
FIG. 3 shows a schematic view of an embodiment of the invention of a film of the overvoltage protection module.

FIG. 3 shows film 18 of overvoltage protection module 14 from FIG. 1. Film 18 has a width $B_F1$ in a central area and a width $B_F2$ in an outer area.

The film is folded in the central area along dashed lines 46, resulting in a U-shaped configuration with one end face 18.1 and two side surfaces 18.2 and 18.3. A distance between the two lines 46 or folds corresponds ideally to second width B2 of end face 26.1 of main leg 26. Width $B_F1$ corresponds ideally to the distance between the two steps 34 of end face 26.1 of the main leg.

Three sections 48 are arranged in the area between the two lines 46 or folds, wherein the film is transparent at least in the three sections 48. A position of sections 48 along width $B_F1$ corresponds to a position of cutouts 32 of end face 26.1 of main leg 26 between edges 34.

Further, the film has two through holes 62, the cross section of which corresponds to alignment plugs 38 arranged on support frame 16 and their position is matched to the position of alignment plugs 38 of support frame 16.

Figure 4:
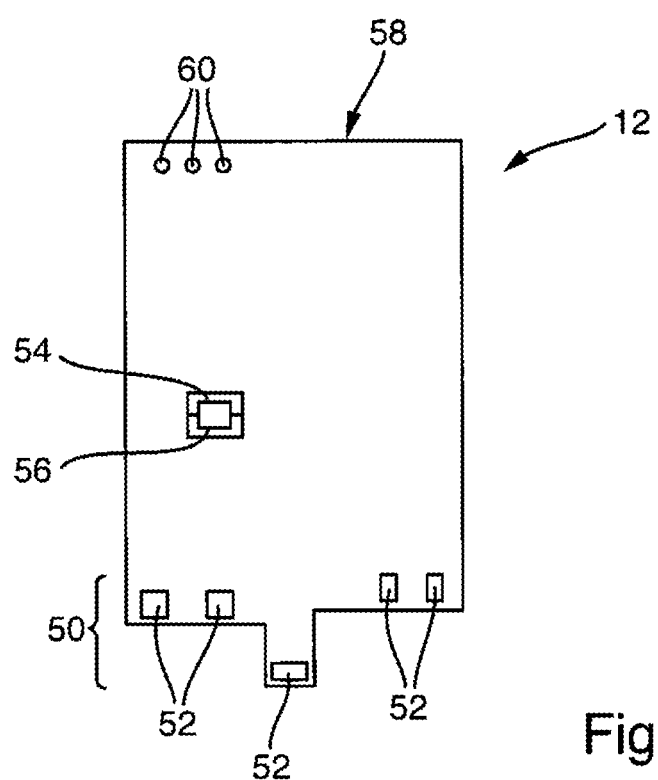
FIG. 4 shows a schematic view of a first embodiment of the invention of a circuit board of the overvoltage protection module.

Circuit board 12 of overvoltage protection module 14 of FIG. 1 is shown in the illustration of FIG. 4. Circuit board 12 comprises a contact blade 50, wherein contact blade 50 has five contact surfaces 52.

Circuit board 12 has a through opening 54 and an overvoltage protection unit 56 arranged in through opening 54, wherein overvoltage protection unit 56 is connected to traces of circuit board 18. Three LEDs are arranged as optical signal transmitters 60 at an edge 58 of circuit board 12, said edge being opposite to contact blade 50.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A housing for receiving a circuit board with an overvoltage protection unit, the housing comprising:
   a support frame formed at least partially of a thermoplastic material and having a main leg, two side legs adjoining the main leg at one end in each case, and at least one lateral flat brace extending between the two side legs; and
   a film formed at least partially of a thermoplastic material and is formed U-shaped with an end face and two side surfaces,
   wherein the end face of the film at least partially covers an end face of the main leg,
   wherein each side surface of the film at least partially covers the two side legs and the at least one lateral flat brace,
   wherein the film is materially connected to the two side legs such that the housing made up of the support frame and film is at least partially open on a side opposite the end face of the film, and
   wherein the film is configured to enclose a bottom side of the circuit board received in the housing and a top side of the circuit board received in the housing; and
   wherein the support frame is U-shaped, and wherein the U-shape of the film is disposed 90° relative to the U-shape of the support frame.

2. The housing according to claim 1, wherein the at least one lateral flat brace is formed as a surface with at least one through opening or as a web.

3. The housing according to claim 1, wherein the support frame is formed of a different material than the film.

4. The housing according to claim 1, wherein the support frame, in an extension of the main leg, has an additional receptacle adjoining a first side leg of the two side legs or a second side leg of the two side legs for a digital connector having at least four contacts.

5. The housing according to claim 1, wherein the two side legs each have an end face, a first side surface adjoining the end face of the two side legs, and a second side surface adjoining the end face of the two side legs and being opposite the first side surface.

6. The housing according to claim 5, wherein the end faces of the two side legs each have a width, which is less than or equal to a maximum width of the end face of the main leg from the first side surface to the second side surface.

7. The housing according to claim 1, wherein the main leg of the support frame has at least one first area having a maximum width measured in a direction running substantially parallel to a surface normal of the brace 22, wherein the maximum width is less than 7 mm or in a range between 6.3 mm and 6.1 mm or exactly 6.2 mm or less than 6.2 mm.

8. The housing according to claim 7, wherein the end face of the main leg has at least one second area, delimited by two steps, with a second width, and wherein the second width is smaller than the maximum width of the at least one first area.

9. The housing according to claim 1, wherein the end face of the main leg has at least one through opening or at least one cutout.

10. The housing according to claim 9, wherein the film covers the at least one through opening or the at least one cutout of the end face of the main leg with a first film section, and wherein the first film section is transparent.

11. The housing according to claim 1, wherein the first side leg or the second side leg have at least one alignment plug, and wherein the film has a through hole corresponding to the at least one alignment plug.

12. The housing according to claim 1, wherein the first side leg or the second side leg have a bevel terminating with the film.

13. The housing according to claim 1, wherein the film and the support frame are non-positively and/or materially connected to each other by welding or by heat staking.

14. An overvoltage protection module comprising:
a circuit board with an overvoltage protection unit; and
a housing according to claim 1.

15. The overvoltage protection module according to claim 14, wherein the circuit board has at least one contact blade with at least one contact surface, wherein the contact blade of the circuit board protrudes beyond the at least one lateral flat brace of the support frame or beyond the first side leg and/or the second side leg.

16. The housing according to claim 1, wherein each side surface of the film exactly overlaps the two side legs.

17. The housing according to claim 1, wherein the top side of the circuit board and the bottom side of the circuit board are enclosed solely by the film.

18. An overvoltage protection module comprising:
a circuit board with an overvoltage protection unit; and
a housing for receiving the circuit board, the housing comprising: a support frame formed of a thermoplastic material, comprising:
a main leg;
two side legs adjoining the main leg; and
a lateral flat brace extending between the two side legs; and a U-shaped film formed of a thermoplastic material with an end face and two side surfaces, the end face of the U-shaped film at least partially covering an end face of the main leg,
wherein each side surface of the U-shaped film covers the two side legs and the at least one lateral flat brace, and
wherein the U-shaped film is configured to enclose a bottom side of the circuit board received in the housing and a top side of the circuit board received in the housing; and
wherein the support frame is U-shaped, and wherein the U-shaped film is disposed 90° relative to the U-shape of the support frame.

* * * * *